(12) United States Patent
Lu et al.

(10) Patent No.: US 10,594,890 B2
(45) Date of Patent: Mar. 17, 2020

(54) COMPRESSING EACH OBJECT IN AN ELECTRONIC DOCUMENT

(71) Applicants: Hewlett-Packard Development Company, L.P., Houston, TX (US); Purdue Research Foundation, West Lafayette, IN (US)

(72) Inventors: Cheng Lu, West Lafayette, IN (US); Mark Shaw, Meridian, ID (US); David C Day, Boise, ID (US); Randall G Guay, Meridian, ID (US); Jan Allebach, West Lafayette, IN (US)

(73) Assignees: Hewlett-Packard Development Company, L.P., Spring, TX (US); Purdue Research Foundation, West Lafayette, IN (US)

( * ) Notice: Subject to any disclaimer, the term of this patent is extended or adjusted under 35 U.S.C. 154(b) by 74 days.

(21) Appl. No.: 15/767,178

(22) PCT Filed: Feb. 11, 2016

(86) PCT No.: PCT/US2016/017578
§ 371 (c)(1),
(2) Date: Apr. 10, 2018

(87) PCT Pub. No.: WO2017/138947
PCT Pub. Date: Aug. 17, 2017

(65) Prior Publication Data
US 2018/0295255 A1  Oct. 11, 2018

(51) Int. Cl.
*G06K 9/46* (2006.01)
*H04N 1/32* (2006.01)
(Continued)

(52) U.S. Cl.
CPC .......... *H04N 1/32277* (2013.01); *H03M 7/30* (2013.01); *H03M 7/3059* (2013.01);
(Continued)

(58) Field of Classification Search
None
See application file for complete search history.

(56) References Cited

U.S. PATENT DOCUMENTS 5,432,871 A * 7/1995 Novik ................ H04N 1/32771
348/14.13
5,479,587 A * 12/1995 Campbell .............. G06K 15/00
358/1.11

(Continued)

FOREIGN PATENT DOCUMENTS

JP         06020091 A  *  1/1994
WO      WO-02-30104 A2    11/2001

OTHER PUBLICATIONS

Comparative analysis—color images, Ramandeep Kaur et al., 2248-9622, 2014, pp. 56-60 (Year: 2014).*

(Continued)

*Primary Examiner* — Jayesh A Patel
(74) *Attorney, Agent, or Firm* — Fabian VanCott

(57) ABSTRACT

A device includes a processor and associated memory; and a compressor for compressing data representing an electronic document, the electronic document comprising a number of objects. The compressor is to determine for each object of the document whether data of that object is to be compressed with lossy or lossless compression and to compress the data accordingly to generate a compressed electronic document.

14 Claims, 14 Drawing Sheets

(51) Int. Cl.
*H03M 7/30* (2006.01)
*H04L 29/06* (2006.01)
*G06F 3/12* (2006.01)

(52) U.S. Cl.
CPC ......... *H03M 7/607* (2013.01); *H03M 7/6094* (2013.01); *H04N 1/32347* (2013.01); *G06F 3/122* (2013.01); *G06F 3/1244* (2013.01); *H04L 69/04* (2013.01)

(56) References Cited

U.S. PATENT DOCUMENTS

| | | | | |
|---|---|---|---|---|
| 5,686,964 A * | 11/1997 | Tabatabai | ............. | H04N 19/142 |
| | | | | 375/240.01 |
| 5,832,126 A * | 11/1998 | Tanaka | ....................... | G06T 9/00 |
| | | | | 382/239 |
| 5,982,937 A * | 11/1999 | Accad | ...................... | H04N 1/41 |
| | | | | 382/166 |
| 5,999,710 A * | 12/1999 | Smith | .................... | G06K 15/12 |
| | | | | 358/1.13 |
| 6,031,939 A | 2/2000 | Gilbert et al. | | |
| 6,324,305 B1 | 11/2001 | Holladay et al. | | |
| 6,330,363 B1 | 12/2001 | Accad | | |
| 6,778,291 B1 * | 8/2004 | Clouthier | ............... | H04N 19/12 |
| | | | | 358/1.15 |
| 6,792,151 B1 | 9/2004 | Barnes et al. | | |
| 6,819,271 B2 * | 11/2004 | Geiger | .................... | H03M 7/30 |
| | | | | 341/51 |
| 7,130,471 B2 | 10/2006 | Bossut et al. | | |
| 8,229,235 B2 * | 7/2012 | Kim | ..................... | H04N 19/176 |
| | | | | 382/234 |
| 8,903,781 B2 | 12/2014 | Amit et al. | | |
| 2001/0031092 A1 * | 10/2001 | Zeck | ......................... | G06T 9/00 |
| | | | | 382/239 |
| 2003/0007695 A1 | 1/2003 | Bossut et al. | | |
| 2006/0222065 A1 * | 10/2006 | Ramakrishnan | ....... | H04N 19/52 |
| | | | | 375/240.03 |
| 2006/0268356 A1 * | 11/2006 | Shih | ........................ | H04N 1/41 |
| | | | | 358/426.07 |
| 2007/0076966 A1 * | 4/2007 | Lee | .......................... | H04N 1/41 |
| | | | | 382/239 |
| 2007/0127826 A1 * | 6/2007 | Kishi | ..................... | H04N 1/413 |
| | | | | 382/232 |
| 2008/0212130 A1 * | 9/2008 | Jung | ...................... | H03M 7/30 |
| | | | | 358/1.15 |
| 2009/0245629 A1 * | 10/2009 | Hayami | ................ | H04N 1/648 |
| | | | | 382/166 |
| 2009/0316213 A1 * | 12/2009 | Cassidy | .................. | G06K 9/40 |
| | | | | 358/3.03 |
| 2011/0194766 A1 * | 8/2011 | Otsuki | .................... | G06T 5/008 |
| | | | | 382/168 |
| 2013/0275396 A1 | 10/2013 | Condict et al. | | |

OTHER PUBLICATIONS

Webpage, Smart JPEG compression, https://tinyjpg.com/, accessed Feb. 4, 2016~2 pages.

* cited by examiner

COMPRESSING EACH OBJECT IN AN ELECTRONIC DOCUMENT

BACKGROUND

Data compression is used for many applications, particularly where an image or electronic document needs to be processed, stored or transmitted electronically from one device to another. Different types of compression trade off resulting image quality against processing time and file size. The more time is taken for compression processing and the larger the file size, the higher the resulting image quality can be.

BRIEF DESCRIPTION OF THE DRAWINGS

The accompanying drawings illustrate various implementations of the principles described herein and are a part of the specification. The illustrated implementations are merely examples and do not limit the scope of the claims.

DETAILED DESCRIPTION

Figure 1:
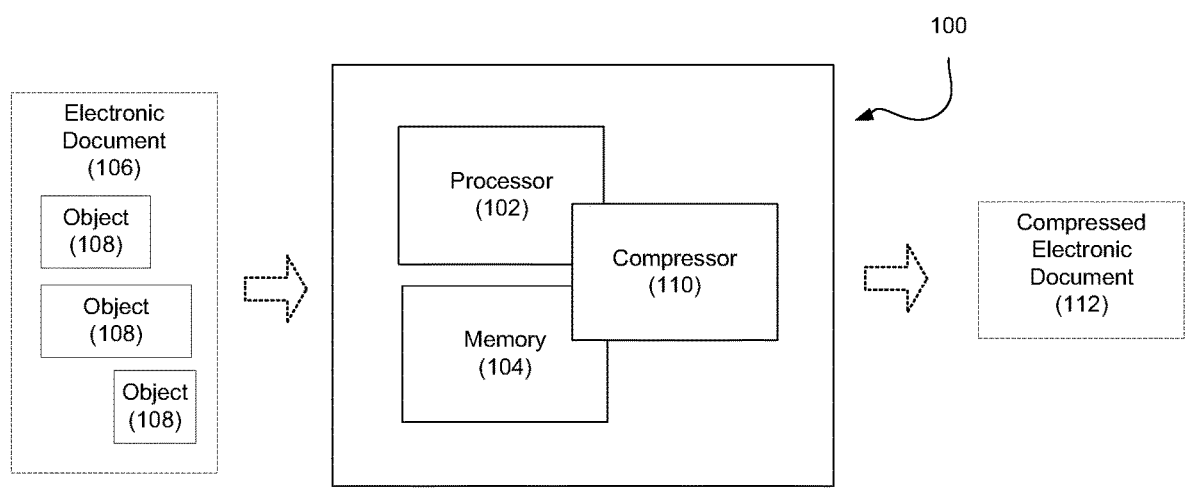
FIG. 1 is a diagram of one example device consistent with the disclosed implementations.

An electronic document may be composed of a number of different objects. For example, one object might be a photograph that is part of the document. Another object might be a block of text arranged with the photograph. Other examples of objects in an electronic document include a background, a gradient and a graphic other than a photograph.

Each object in the electronic document is represented by digital data that collectively is the digital data for the electronic document. This digital data can be used to print the document or display the document on a monitor.

This digital data can also be compressed to make the electronic document easier to store, transmit or otherwise process. In the printing example, computing devices such as a personal computer or a mobile device instruct a printer to print a variety of images or documents. The quality of the printer user's experience is generally dictated by the image quality of the printed document and the amount of time taken to generate the hardcopy. Ideally, image quality is to be as high as possible, while printer process time is to be as low as possible. However, these two factors here cannot be improved simultaneously. Improving image quality is typically done at the expense of longer printer process times due to a larger file size associated with the document which often is the result of less lossy compression. Heavily lossy compressed images can be processed very fast by the printer due to a small file size associated with the image. However, this results in a lower image quality when the image is printed. As a result, an optimization of both of these factors is needed to balance the image quality and the printer process time given the constraints of the printer.

As noted above, different types of compression trade off resulting image quality against processing time and file size. The more time that is taken for compression processing and the larger the resulting compressed data file is allowed to be, the higher the resulting image quality can be. In general, a lossless compression method preserves the original image quality, while still providing some compression of the underlying digital data. In contrast, lossy compression sacrifices some image quality for substantially more compression of the underlying digital data.

Consequently, a document or object that is simply text with a simple background is suitable for compression by a lossless compression method. Examples of lossless compression methods include Run Length Encoding (RLE), Delta Row Compression (DRC), and Zlib (flate) compression. Less complex documents can be handled with lossless compression because this preserves the image quality while providing a resulting small file size for the compressed data.

However, if an image is relatively complex, lossy compression may be needed for the compression to have much beneficial effect on the size of the underlying data file. Thus, an image that is a natural image such as a photograph favors a lossy compression method such as the Joint Photographic Experts Group (JPEG) compression method. JPEG compression provides a balance between a good compression ratio and resulting image quality.

Processing an image that is a natural image using the DRC compression algorithm or the RLE compression algorithm is very inefficient because human vision is not sensitive to high frequency information in the natural image. As a result, users cannot perceive at least some of the information lost in the lossy compression. Additionally, for natural images, using the RLE compression algorithm and the DRC compression algorithm yields very large file sizes because natural images may not include much spatial redundancy. Given these two factors, as described herein, a lossy compression should be used to process natural and other relatively complex images. On the other hand, an image that is a simple structure image is more suitable for lossless compression. For example, a simple structure image, such as a small logo or pure text, will likely have a high spatial redundancy which can be compressed heavily lossless compression without compromising image quality at print time. However, using a lossy compression method such as JPEG compression on a simple structure image tends to blurs edges of text in the image.

As used herein and in the following claims, the term "electronic document" will refer to a document composed of a number of objects, each object represented by digital data, that can be printed or displayed so that a user can review the document. A document may include one single object or any greater number of objects. A document may be composed of one single page or screen or any greater number of pages or screens.

As used herein and in the associated claims, reference to compressing an object or document will be understood to refer to compressing the digital data associated with that object or document.

To optimize the compression of data for a digital document containing a number of objects, the present specification proposes a process for selecting a compression method to be used for each individual object of the document independently and then compressing all the objects of the document accordingly.

For example, the present specification describes a device including: a processor and associated memory; and a compressor for compressing data representing an electronic document, the electronic document comprising a number of objects; the compressor to determine for each object of the document whether data of that object is to be compressed with lossy or lossless compression and to compress the data accordingly to generate a compressed electronic document.

In another example, the present specification describes a method of optimizing compression of data for an electronic document comprising a number of different objects by, for each object of the document, selecting whether data for that object is to be compressed with lossy or lossless compression based on a level of complexity of that corresponding object; and separately compressing the data for each object using a corresponding selected one of lossy and lossless compression to produce a compressed electronic document.

In another example, the present specification describes a non-transitory computer-readable device comprising instructions that, when executed by a processor of a device, cause the device to: receive an electronic document comprising a number of objects; determine, for each object, whether data for that object is to be compressed with lossy or lossless compression based on a level of complexity of the corresponding object; and apply a corresponding lossy or lossless compression to the object to generate compressed data for the electronic document. As used herein, volatile memory devices are still non-transitory.

In addition to the printing example, the individual compression of document objects using different compression methods can be used in any digital send of the document, for example, in scanning a document for transmission in email or storage in a network folder. In such a scenario, dynamic strip compression may be performed at the scanner or multi-function peripheral, followed by sending the compressed job to an email server or a network folder.

In the following description, for purposes of explanation, specific details are set forth in order to provide a thorough understanding of the disclosure. It will be apparent, however, to one skilled in the art that examples consistent with the present disclosure may be practiced without these specific details. Reference in the specification to "an implementation," "an example" or similar language means that a particular feature, structure, or characteristic described in connection with the implementation or example is included in at least that one implementation, but not necessarily in other implementations. The various instances of the phrase "in one implementation" or similar phrases in various places in the specification are not necessarily all referring to the same implementation.

FIG. 1 is a diagram of one example device consistent with the disclosed implementations. As shown in FIG. 1, the device (100) receives as input an electronic document (106) that is composed of a number of objects (108). This document may be stored on the device (100) initially or may be received via a network or other device.

The device (100) itself includes a processor (102) with associated memory (104). The memory (104) provides the programming used by the processor (102) to implement the methods and techniques described herein.

The device (100) also includes a compressor (110) that will be described in greater detail below. The compressor (110) may be an Application Specific Integrated Circuit (ASIC), a program executed by the processor (102) or some combination of hardware and firmware. In operation, the compressor (110) determines for each object (108) of the document (106) whether data of that object is to be compressed with lossy or lossless compression and compresses the data accordingly to generate a compressed electronic document (112).

Figure 2:
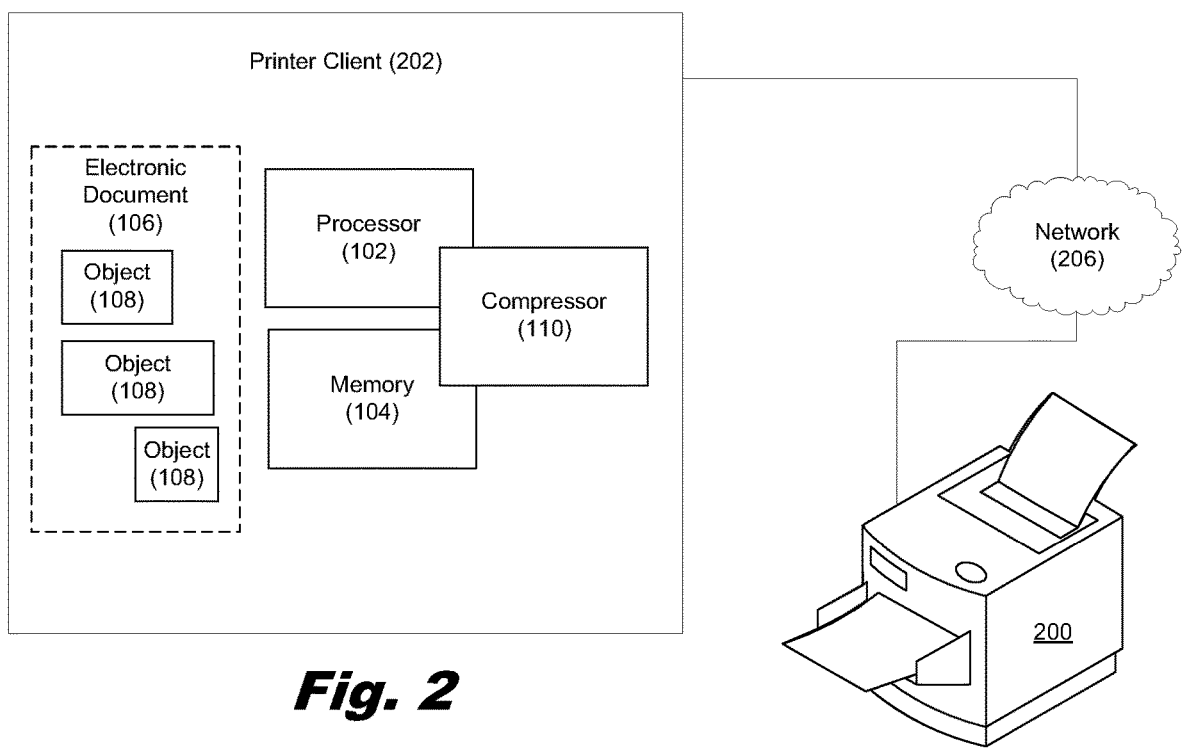
FIG. 2 is a diagram of another example of device consistent with this specification that is implemented in a printer client.

FIG. 2 is a diagram of another example of device consistent with this specification that is implemented in a printer client. As shown in FIG. 2, a printer client (202) is a device configured to send print jobs to a printer (200) for printing. The printer client (202) may be, for example, a laptop or tablet computer, a smartphone or other user device.

The printer client (202) may submit the electronic document (106) to the printer (200) as a print job via a network (206). The network (206) may be the Internet, a Local Area Network, a wireless network, some combination of these or any other data network allowing communication between the client (202) and the printer (200).

Because the print job is to be transmitted over the network (206) to the printer (200), this transmission is facilitated by compressing the electronic document prior to transmission to the printer (200). Consequently, the compressor (110), as described above, may be incorporated into the printer client (202). For example, the compressor (110) may be part of, or operate with, a printer driver of the client (202).

Figure 3:
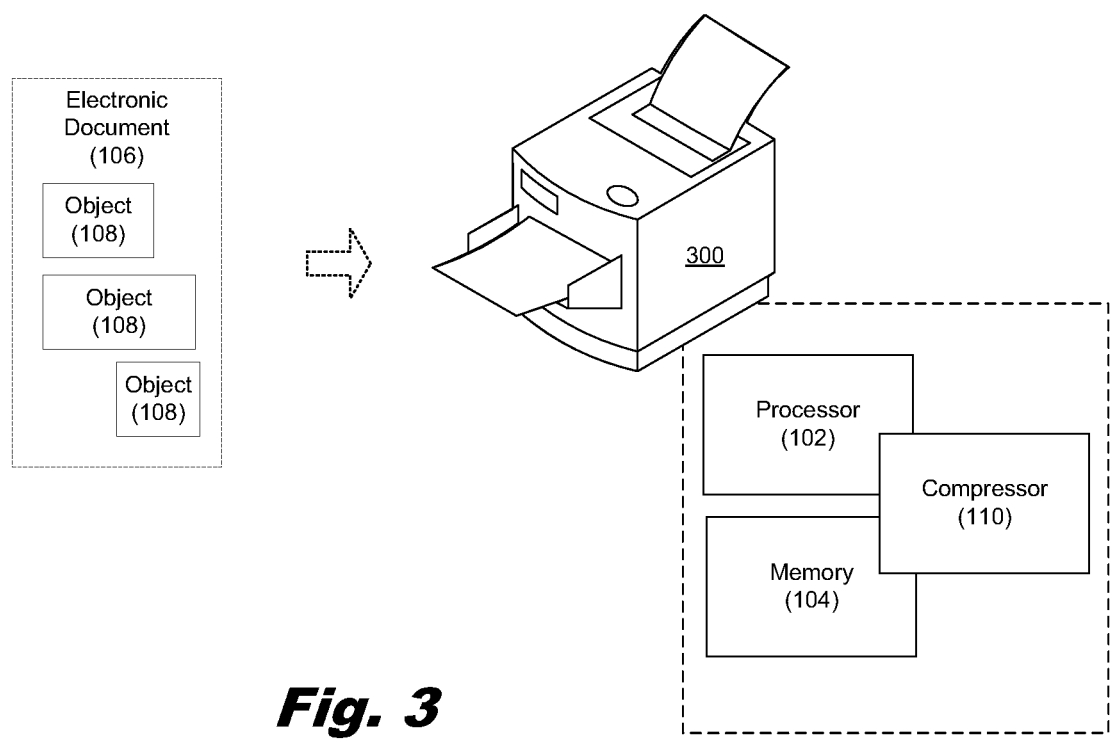
FIG. 3 is a diagram of another example of a device consistent with this specification that is implemented in a printer.

FIG. 3 is a diagram of another example of a device consistent with this specification that is implemented in a printer. As shown in FIG. 3, the printer (300) includes the compressor (110) as described herein. In this example, the printer (300) receives an electronic document (106) as a print job, the document (106) including a number of objects (108).

The printer (300) compresses the data for the document (106) after arrival to facilitate the transmission and processing of the data through the print pipeline of the printer (300).

Accordingly, upon receipt of the document (106) in the printer (300), the compressor (110) can determine for each object (108) of the document (106) whether data of that object is to be compressed with lossy or lossless compression and compress the data accordingly as the printer (300) processes and then prints the print job in hardcopy form.

Figure 4:
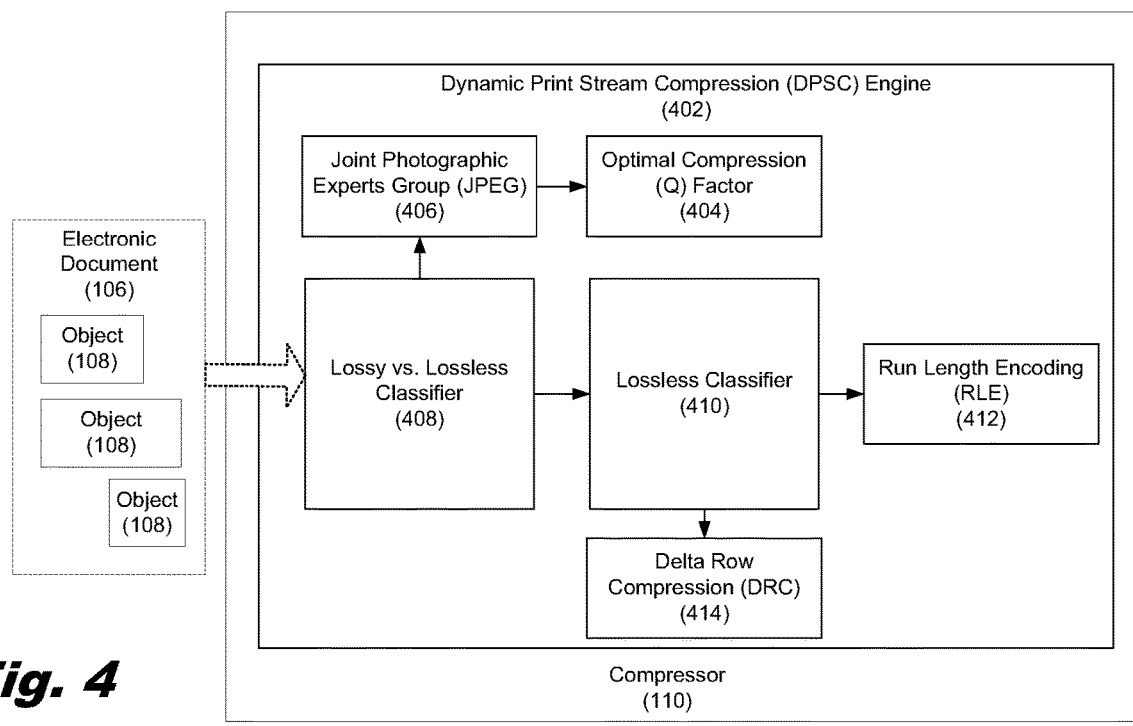
FIG. 4 is a diagram of one example of logic within the compressor, consistent with all the described implementations.

FIG. 4 is a diagram of one example of logic within the compressor, consistent with all the described implementations. This logic may be referred to as a Dynamic Print Stream Compression (DPSC) Engine (402).

As shown in FIG. 4, the electronic document (106) segmented into a number of objects (108) is provided to the DPSC Engine (402). For each object (108) individually, the engine (402) will first apply a lossy v. lossless classifier (408) to determine if that object (108) should be compressed using a lossy or lossless method. How this determination is made will be described in further detail below.

The classifier (408) may include a support vector machine (SVM) to determine if an input object is to be processed by a lossy or lossless. In this example, the SVM is trained using thousands of training images as input for each of which the determination of image complexity and lossy v. lossless compression has been manually determined and is known.

If the object (108) is classified by the classifier (408) as needing lossless compression, the object (108) is then processed by a lossless classifier (410) to determine which of a number of different lossless compression methods will be used. Again, how this determination is made will be described in further detail below. In the present illustrated example, the lossless classifier (410) selects between Run Length Encoding (RLE) (412) and Delta Row Compression (DRC) (414) as two candidate lossless compression methods.

Alternatively, if the object (108) is classified by the first classifier (408) as needing lossy compression, the illustrated example then applies Joint Photographic Experts Group (JPEG) (406) compression to that object. Other examples of lossy compression can be used such as JPEG 2000. Other examples consequently include another classifier to determine which lossy compression method will be used once lossy compression is indicated. However, in the present illustrated example, if lossy compression is indicated, JPEG compression will be used on that corresponding object.

Lossy compression methods, including JPEG, may have an adjustable compression factor that controls the tradeoff between image quality, processing time and compressed data file size. Thus, the JPEG compression method can be adjusted from execution to execution by adjusting the compression factor so as to provide, for example, a greater degree of compression but lower image quality. A different compression factor, in contrast, can decrease the degree of compression achieved for greater image quality. In JPEG, this compression factor is called the Q factor.

In FIG. 4, if lossy compression is selected by the first classifier (408), JPEG compression will be used. Additionally, the engine (402) will determine an optimal compression factor (404) to use on that object for the lossy compression. Determination of the optimal compression or Q factor will be described in further detail below.

Figure 5:
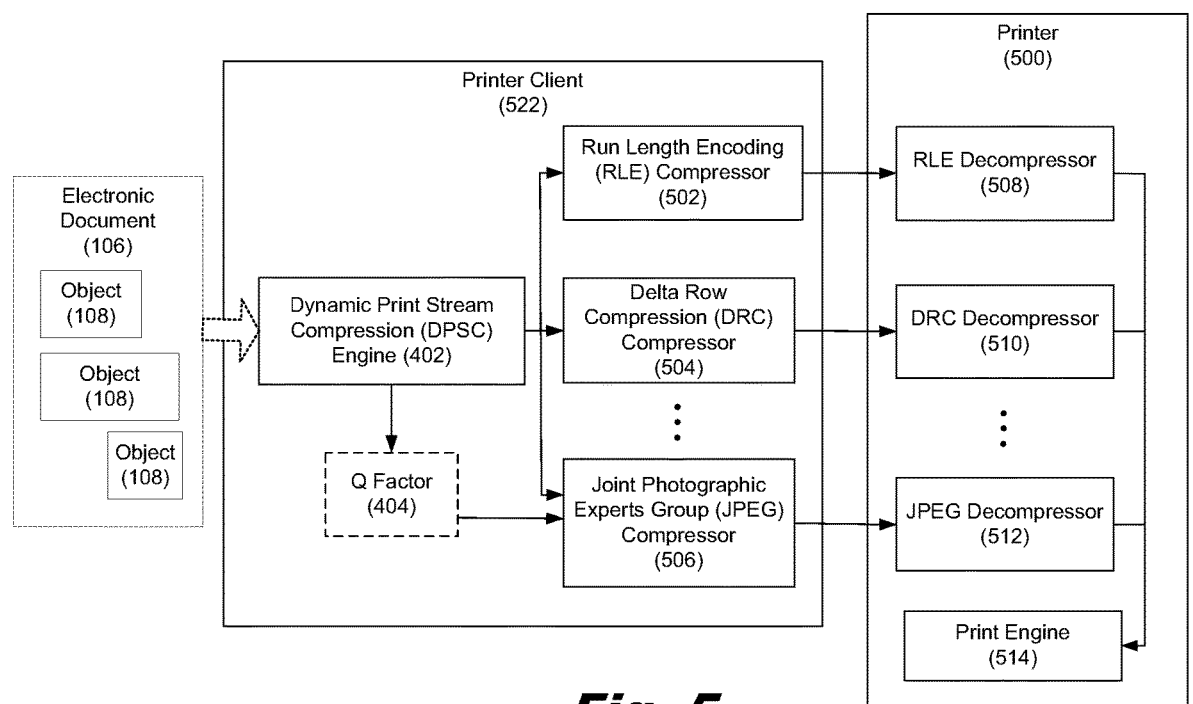
FIG. 5 is a diagram of another example system including a printer client and printer, consistent with the disclosed implementations.

FIG. 5 is a diagram of another example system including a printer client and printer, consistent with the disclosed implementations. In the example of FIG. 5, a printer client (522) receives or has the electronic document (106) composed of a number of objects (108). The printer client (522) also includes a DPSC engine (402) similar to that described in connection with FIG. 4 above.

As described above, the classifiers of the engine (402) will, for each object (108) of the document (106), determine whether that object is to be compressed with lossy or lossless compression, including a specific type of compression method to use whether lossy or lossless and, if lossy compression is selected, an optimal compression factor for the lossy compression.

As shown in FIG. 5, the printer client (522) includes a number of compressors each applying a different compression method. In the illustrated example, the printer client (522) has, at least, a RLE compressor (502), a DRC compressor (504) and a JPEG compressor (506). However, as indicated by the ellipses, the printer client (522) could include any number of lossless and lossy compressors.

As each object (108) is processed by the DPSC engine (402), the data for that object is then output to a corresponding compressor based on the determination by the engine (402) as to by what method that object is to be compressed. If the object is to be compressed using lossy compression, e.g., JPEG compressor (506), the engine (402) also provides a compression factor (404), such as a Q factor, to the lossy compressor (506). The compressed objects (108) are then transmitted to a printer (500).

The printer (500) includes a corresponding number of decompressors (508-512) to appropriately decompress the data for each object (108) of the document (106). At an appropriate point in the processing, the decompressed data is input to the print engine (514) of the printer (500) so that the document (106) is rendered in hardcopy.

Figure 6:
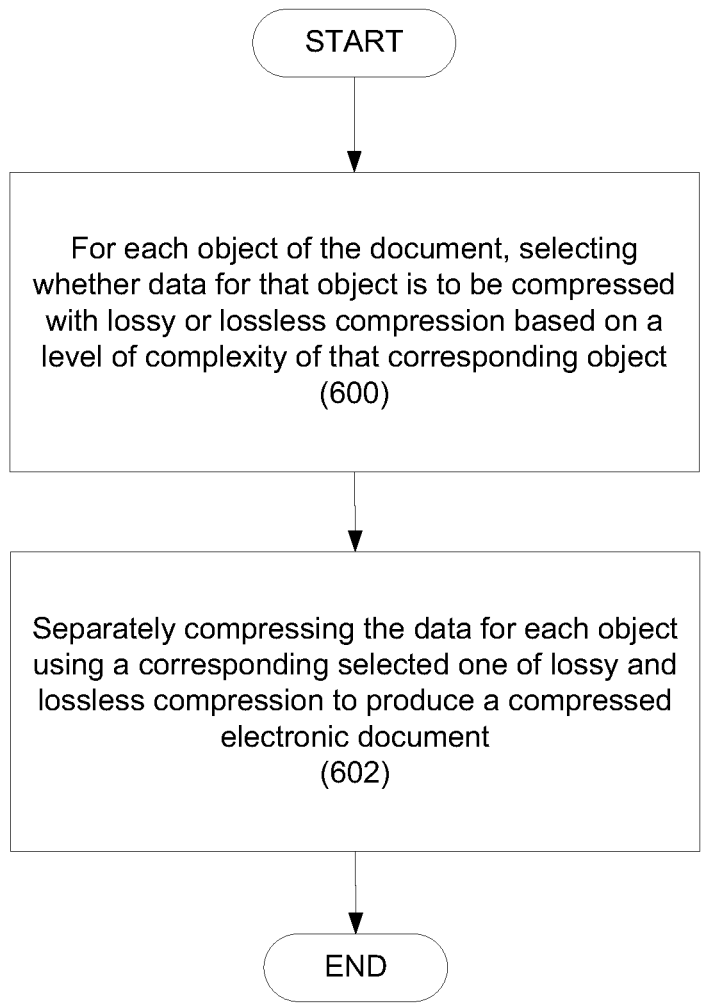
FIG. 6 is a flowchart of an example method of selecting a compression method for each object of an electronic document, consistent with the disclosed implementations.

FIG. 6 is a flowchart of an example method of selecting a compression method for each object of an electronic document, consistent with the disclosed implementations. As shown in FIG. 6, this example method includes, for each object of the document, selecting (600) whether data for that object is to be compressed with lossy or lossless compression based on a level of complexity of that corresponding object; and separately compressing (602) the data for each object using a corresponding selected one of lossy and lossless compression to produce a compressed electronic document.

Figure 7:
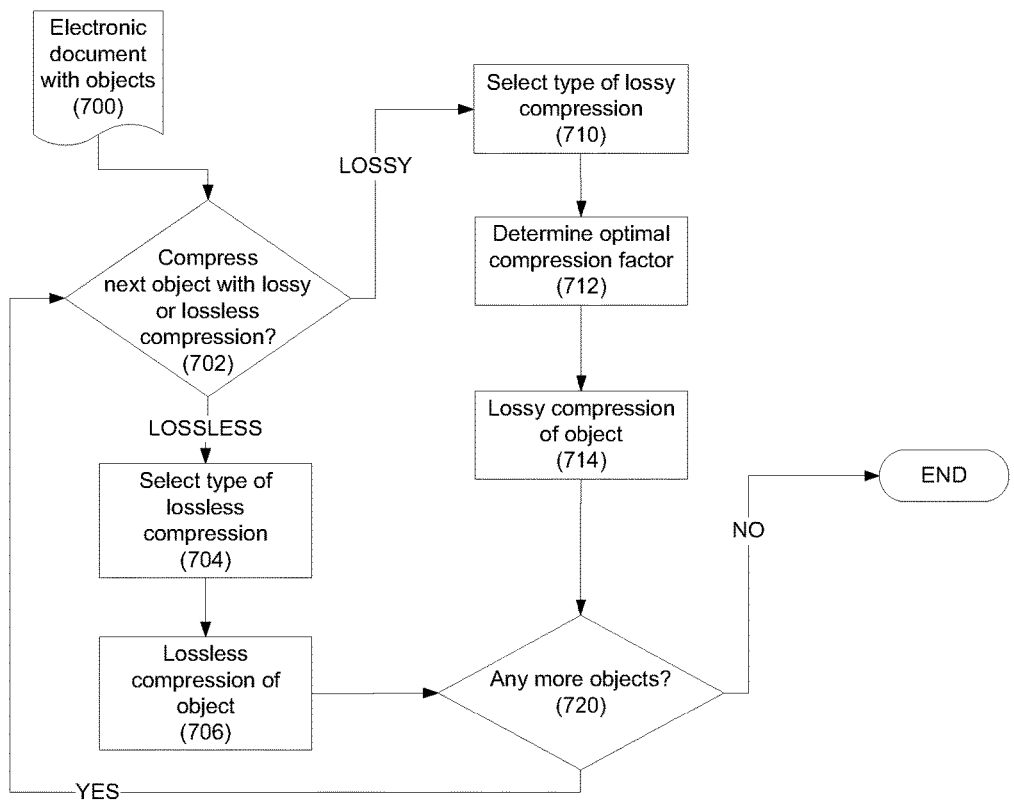
FIG. 7 is a flowchart of another example method of selecting a compression method for each object of an electronic document, consistent with the disclosed implementations.

FIG. 7 is a flowchart of another example method of selecting a compression method for each object of an electronic document, consistent with the disclosed implementations. As shown in FIG. 7, the method begins with an electronic document (700) composed of objects, as described herein. Each object is considered individually to determine a compression method to be used on that object. In some examples, the input document is transformed into LUV color space such that only the luminance channel information remains. Using the luminance channel information, the time needed for subsequent analysis for the classification of the input document objects and an image quality analysis is reduced.

This analysis begins with a determination (702) of whether the next object up for consideration is to be compressed with lossy or lossless compression. If lossless compression is indicated, the method next selects (704) a specific type of lossless compression to use. The object is the compressed (706) using that selected form of lossless compression. Examples of lossless compression methods are given above.

Alternatively, if lossy compression is indicated at the determination (702), the method may then select (710) from among candidate methods of lossy compression as to exactly which method of lossy compression will be used. JPEG and JPEG 2000 are examples of lossy compression methods.

The method also then determines (712) an optimal compression factor for the selected lossy compression method. The object is the compressed (714) using the selected form of lossy compression and the indicated compression factor.

Next, it is determined (720) if there are any more objects of the document being processed. If there are, the next object is processed as described above, starting with determination (702). If, however, all the objects of the document have been individually compressed, the document is compressed and can be stored, transmitted or further processed, as needed, in its compressed state.

Figure 8:
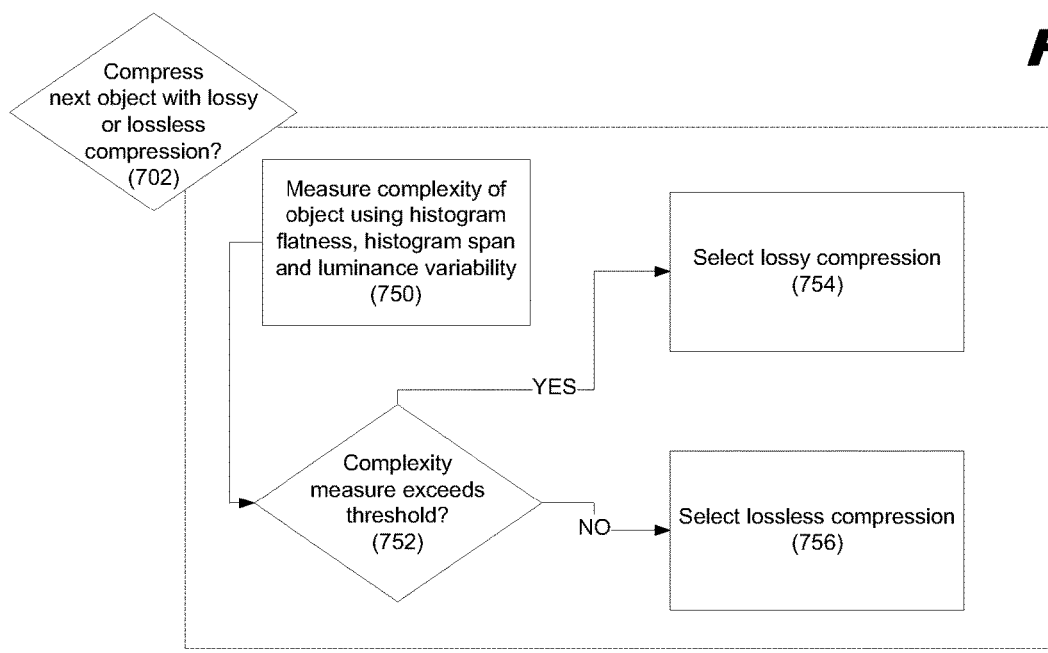
FIG. 8 is a flowchart giving an example of the determination between whether to use lossy or lossless compression for an object, consistent with disclosed implementations.

FIG. 8 is a flowchart giving an example of the determination between whether to use lossy or lossless compression for an object, consistent with disclosed implementations. As shown in FIG. 8, the complexity of each object is measured (750). As noted above, the subsequent processing of objects with a relatively high complexity may be facilitated by lossy compression rather than lossless compression. Thus, the complexity is quantified and compared to some standard. If the measure of complexity is judged (752) to exceed a threshold, lossy compression is selected (754). Alternatively, if the measure of complexity falls below the applied standard or threshold, lossless compression is selected (756).

As also shown in FIG. 8, the complexity of an object can be measured using histogram flatness, histogram span and luminance variability.

Histogram Flatness

Figure 12A:
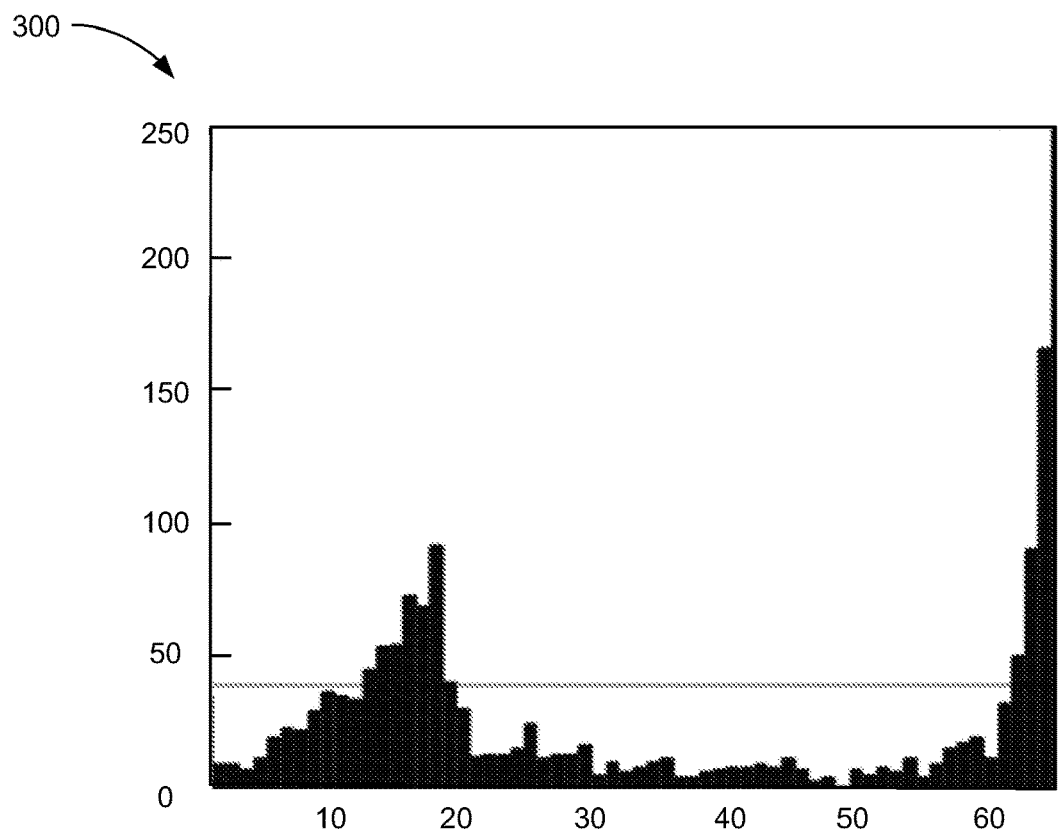
FIGS. 12A and 12B are example histograms of objects of different complexity for illustrating one example of the determination between whether to use lossy or lossless compression for an object, consistent with disclosed implementations.
Figure 12B:
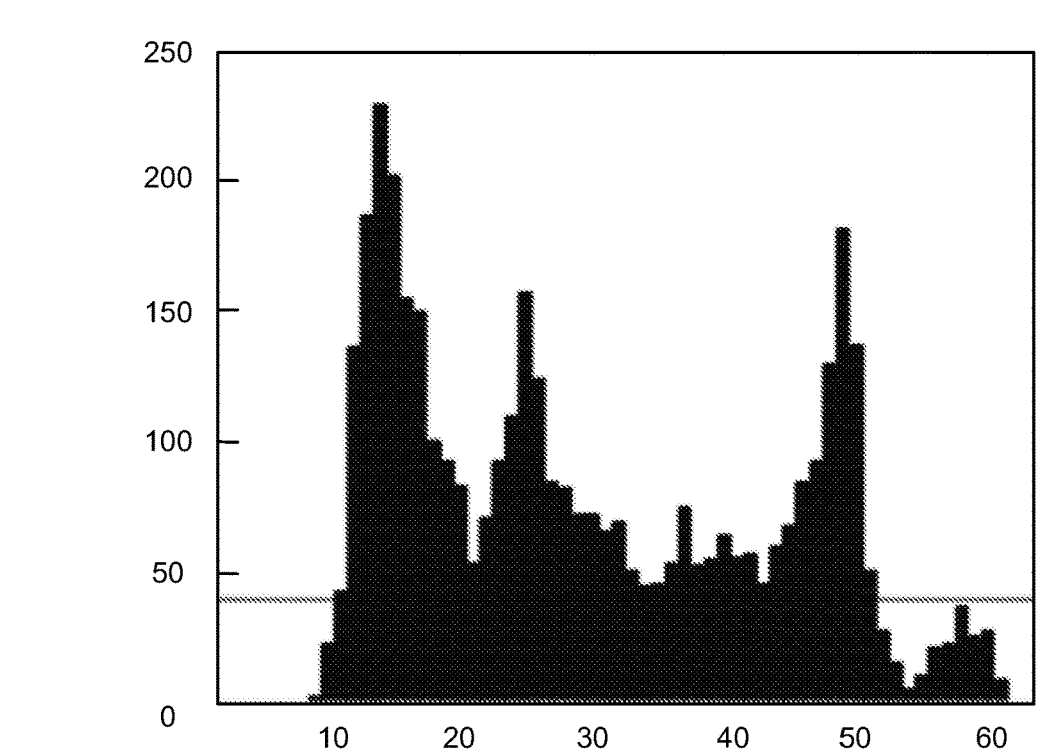

A histogram is created for an input object. If a histogram is created for an input object that is a relative simple structure image, the histogram is peaky as illustrated in FIG. 12A. For a simple structure image there are roughly two peaks in the histogram. One of the peaks is associated with the text pixels in the simple structure image. The other peak is associated with the background pixels in the simple structure image. However, if a histogram is created for an input image such as a natural image or photogram, the histogram is more flat and widespread as illustrated in FIG. 12B. In order to quantify this difference in the histograms of FIGS. 12A and 12B, the histogram flatness is defined as the histograms geometric average over arithmetic average as defined in equation 1.

$$Flatness = \frac{\sqrt[N]{\prod_{n=0}^{N-1} x(n)}}{\frac{\sum_{n=0}^{N-1} x(n)}{N}} \quad \text{(Equation 1)}$$

where x(n) is a number in bin n.

Histogram Span

The histogram flatness may not be conclusively determinative of object complexity when a histogram is relatively sparse. For example, if a histogram satisfies X(2n)=k and X(2n+1)=0, the input object should be closer in resemblance to a natural image than a simple structure image. However, since the histogram flatness for this input object is peaky, the histogram flatness classifies the input object as a simple structure image. To solve this issue, a histogram span is used. The histogram span is defined as a width of a smallest interval that includes 75 percent pixels.

Luminance Variability Score

Luminance variability score is based on the fact that a non-text region of an input image typically contains only a few gray level values. To determine a luminance variability score, the input object is sectioned off into 8 by 8 pixel blocks and a mean value of each of the blocks is calculated. A 16-bin histogram is created for the mean values for the blocks for the entire input object. The luminance variability score is defined as the number of non-zero bins in the 16-bin histogram.

Figure 13:
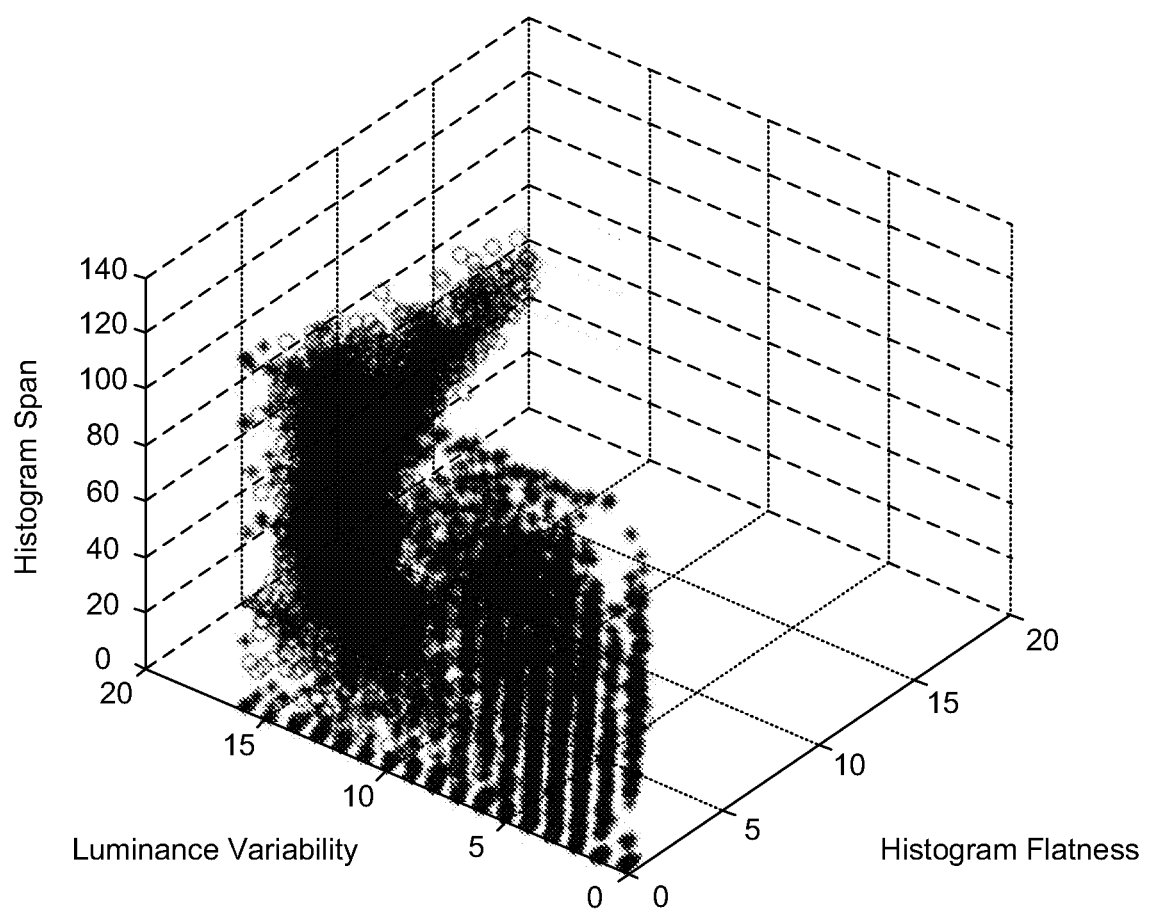
FIG. 13 is a three-dimensional graph showing histogram span on the vertical axis, luminance variability on a width axis and histogram flatness on a depth axis for purposes of assigning an object for lossy or lossless compression, consistent with disclosed implementations.

FIG. 13 is a three-dimensional graph showing histogram span on the vertical axis, luminance variability on a width axis and histogram flatness on a depth axis. Using these three values for any object, that object can be designated as needing lossless or lossy compression.

In the illustrated example, objects whose measured position in all three variables is represented by a "+" would be designated as needing lossless compression. These data points are clustered in the figure on or near the plane defined by the histogram span and luminance variability axes.

The objects whose measured position in these three variables is represented by an open circle "○" would be designated as needing lossy compression. This cluster of data points extends depth-wise into the figure along the histogram flatness axis.

Appropriate boundaries using these three variables can be drawn differently to designate objects for lossy or lossless compression depending on a particular application. As described herein, this technique can be applied to print jobs being printed in hardcopy form. However, these same techniques can be applied in other image processing applications that involve data compression.

Figure 9:
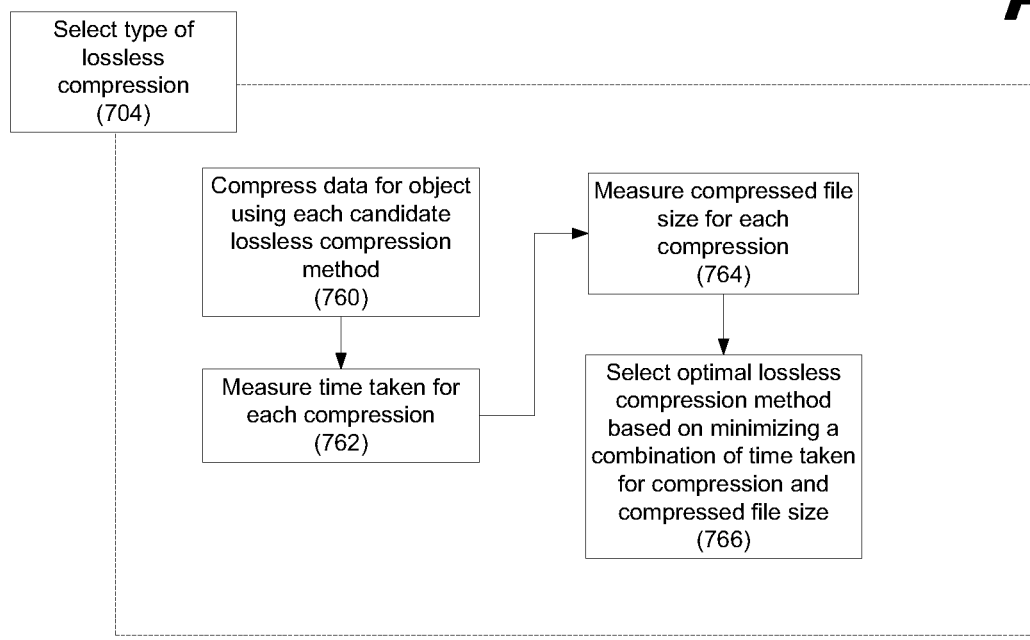
FIG. 9 is a flowchart showing an example method for selecting a particular type of lossless compression for an object that has been designated for lossless compression, consistent with disclosed implementations.

FIG. 9 is a flowchart showing an example method for selecting a particular type of lossless compression for an object that has been designated for lossless compression, consistent with disclosed implementations. As noted above, there are any number of available lossless compression methods including, for example, Run Length Encoding (RLE), Delta Row Compression (DRC), and Zlib (flate) compression. The lossless compression method that will result in the fastest decompression should be selected.

As shown in FIG. 9, the example method for making this selection is as follows. First, the data for the object in question is compressed (760) using each of the candidate lossless compression methods under consideration. The amount of time taken to complete that compression is measured (762). Additionally, this size of the compressed data file for that object is measured (764). Considering these two variables, the optimal lossless compression method is selected (766).

This selection is based on minimizing some combined measurement of time taken for compression and compressed file size (766). These two factors are taken as predictive of which compressed result can be decompressed most quickly by a corresponding decompressor.

In a more specific example, the input object can be compressed by both RLE compression and DRC compression and then evaluated for predictors of how readily each result can be decompressed. The factors that have been found useful in predicting decompression speed are compression time ratio (CTR) as defined in equation 2 and compression size ratio (CSR) as defined in equation 3 below.

The compression time for RLE (Tc RLE) and the compression time for DRC (Tc DRC) are measured. Also, a compressed file size for RLE (FRLE) and a compressed file size for DRC (FDRC) are measured. This allows the CTR and CSR to be defined by equation 2 and equation 3 respectively:

$$CTR = \frac{TcRLE}{TcDRC} \quad \text{(Equation 2)}$$

$$CSR = \frac{FRLE}{DFRC} \quad \text{(Equation 3)}$$

With a training set of images and these equations above, an SVM can be trained to classify input objects that are simple structure images such that the RLE compression algorithm or the DRC compression algorithm can be used on the input image. Again, minimizing some combined measurement of time taken for compression and compressed file size (766), the correct lossless compression method can be selected.

Figure 10:
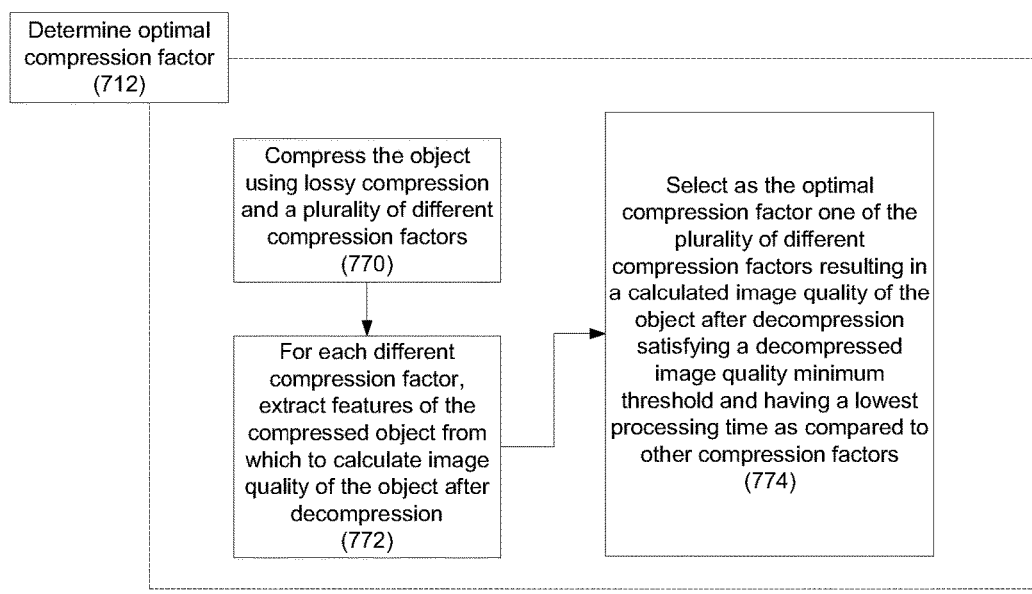
FIG. 10 is a flowchart showing an example method for determining an optimal compression factor for compressing an object that has been designated for lossy compression, consistent with disclosed implementations.

FIG. 10 is a flowchart showing an example method for determining an optimal compression factor for compressing an object that has been designated for lossy compression, consistent with disclosed implementations. As shown in FIG. 10, this method begins by compressing (770) the object using the indicated lossy compression method in multiple iterations, each iteration using a different compression factor.

For each different compression factor, features are extracted (772) from the compressed object that provide an indication of image quality after the object is decompressed. This indication of image quality following decompression is then compared to a standard or threshold for minimum image quality desired following decompression. The optimal compression factor is the selected (774) as that compression factor resulting in a calculated image quality of the object after decompression satisfying the decompressed image quality minimum threshold and having a lowest processing time as compared to the other compression factors tested.

In the example of JPEG as the lossy compression method used, the Q factor is a variable in the compression algorithm for the JPEG compression algorithm that controls a compression ratio and image quality for the given input image or object. However, the Q factor does not change linearly with either the compression ratio or the image quality. Three features such as, average differences across block boundaries, in-block absolute difference, and zero-crossing rate can quantify the image quality when using JPEG compression. Each of these three features are calculated horizontally and then vertically for the input image or object.

If an image signal such as x(m,n) for m∈[1,M] and n∈[1,N], a difference signal along each horizontal lines is calculated as defined in equation 4:

$$d_h(m,n) = x(m,n+1) - x(m,n) \, x \in [1, N-1] \quad \text{(Equation 4)}$$

Average differences across block boundaries illustrate a blockiness effect caused by the JPEG compression algorithm. This blockiness effect caused by the JPEG compression algorithm is defined in equation 5:

$$B_h = \frac{1}{M\left(\left[\frac{N}{8}\right]-1\right)} \sum_{i=1}^{M} \sum_{j=1}^{\left[\frac{N}{8}\right]-1} |d_h(i, 8j)| \quad \text{(Equation 5)}$$

Two of the other three features are related to activity associated with an image signal. The activity is measured by two factors. The first of the two factors is in block absolute difference. The block absolute difference is defined in equation 6:

$$A_h = \frac{1}{7}\left[\frac{8}{M(N-1)} \sum_{i=1}^{M} \sum_{j=1}^{N-1} |d_h(i,j) B_h|\right] \quad \text{(Equation 6)}$$

The second of the two factors is a zero cross rate. The zero cross rate is first defined by equation 7:

$$Z_h(m,n) = \begin{cases} 1, & \text{horizontal zero - crossing at } d_h(m,n) \\ 0, & \text{otherwise} \end{cases} \quad \text{(Equation 7)}$$

A horizontal zero-crossing rate then can be estimated. The horizontal zero-crossing rate is estimated via equation 8:

$$Z_h = \frac{1}{M(N-2)} \sum_{i=1}^{M} \sum_{j=1}^{N2} Z_h(m,n) \quad \text{(Equation 8)}$$

Similarly, vertical features of average differences across block boundaries, in-block absolute difference, and zero-crossing rate are calculated using the equations above for vertical lines instead of horizontal lines. The horizontal and vertical features are averaged to calculate the overall features. The overall features are defined in equation 9:

$$B = \frac{B_h + B_v}{2}, \quad A = \frac{A_h + A_v}{2}, \quad Z = \frac{Z_h + Z_v}{2} \quad \text{(Equation 9)}$$

A final prediction of a mean opinion score (MOS) is calculated using the above three features as defined in equation 10:

$$MOS = \alpha + \beta B^{\gamma 1} A^{\gamma 2} C^{\gamma 3} \quad \text{(Equation 10)}$$

Figure 14:
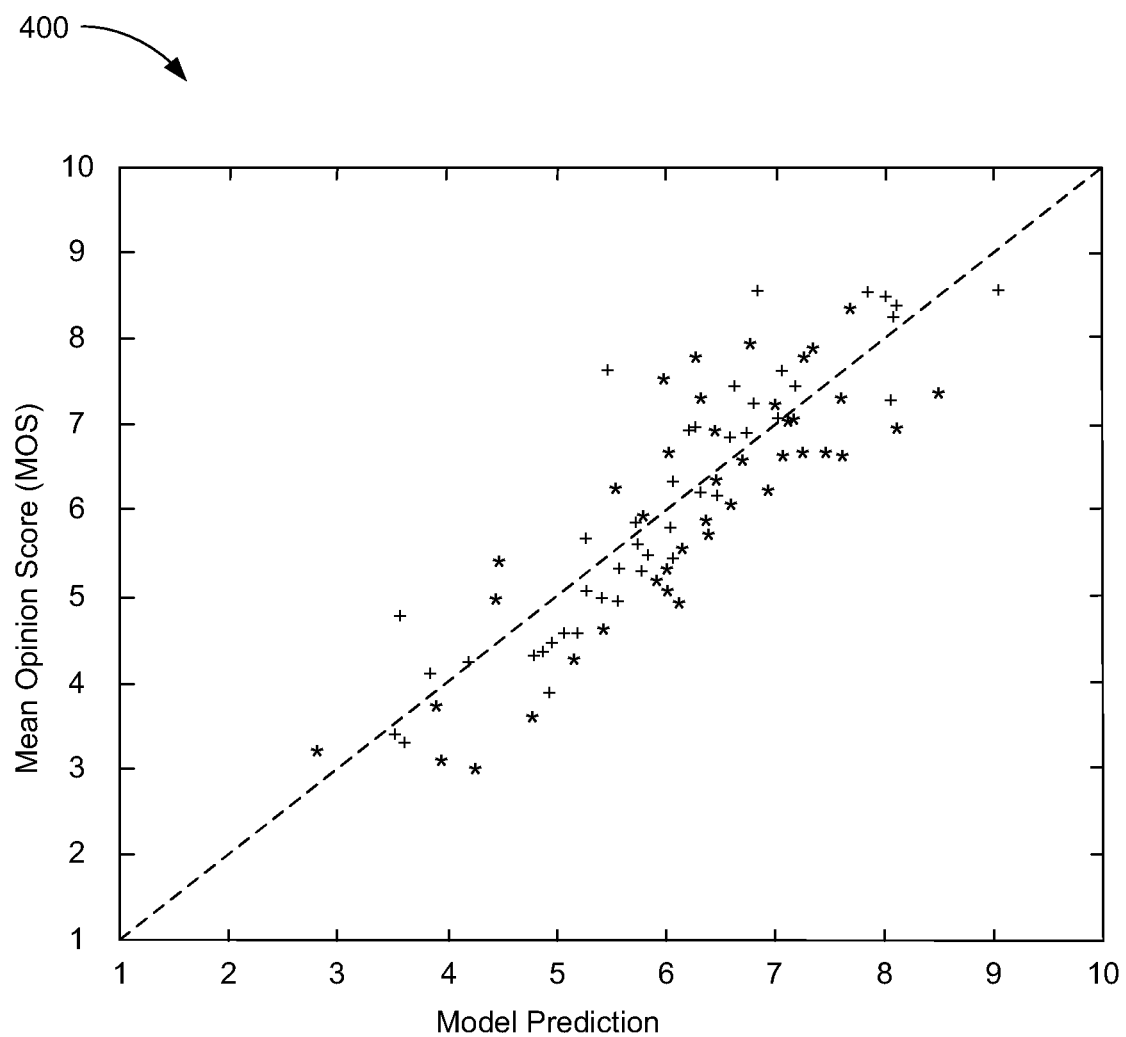
FIG. 14 is a graph that illustrates the result of an MOS prediction trained by two groups of input images, Throughout the drawings, identical reference numbers designate similar, but not necessarily identical, elements.

FIG. 14 illustrates the result of a MOS prediction trained by two groups of input images. A threshold mean opinion score (MOS) is set depending on how good of an image quality is desired. For any input image that is a natural image, the input image is compressed starting from Qi=10, 20, 30 . . . 100 where Qi is the quality factor. For each Qi, the three features of compressed image are extracted. The predicted mean opinion score (MOSi) is calculated at each Qi based on these 3 features. When a first Qi where MOSi is greater than MOST is identified, i*=I is set. This allows the Q factor to be determined. The Q factor is defined in equation 11:

$$Q^* = Q_{i^*} \quad \text{(Equation 11)}$$

The input object or image is compressed by JPEG compression at a Q factor of Q* for storage or transmission, such as to a printer.

Figure 11:
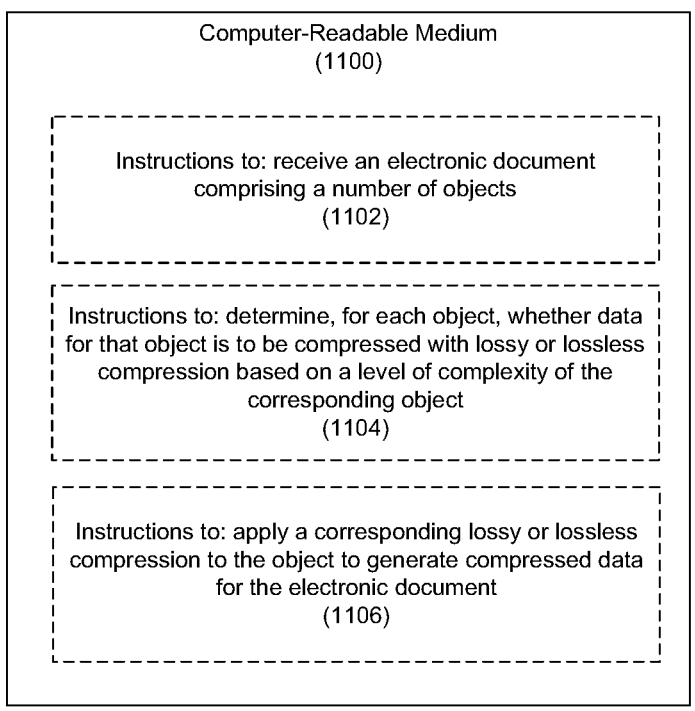
FIG. 11 is a diagram of a non-transitory computer-readable medium bearing instructions for a compression selection method, consistent with disclosed implementations.

FIG. 11 is a diagram of a non-transitory computer-readable medium bearing instructions for a compression selection method, consistent with disclosed implementations. As shown in FIG. 11, a non-transitory computer-readable medium (1100) includes instructions that, when executed by a processor of a device, cause the device to: receive (1102) an electronic document comprising a number of objects; determine (1104), for each object, whether data for that object is to be compressed with lossy or lossless compression based on a level of complexity of the corresponding object; and apply (1106) a corresponding lossy or lossless compression to the object to generate compressed data for the electronic document.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A device comprising:
a processor and associated memory; and
a compressor for compressing data representing an electronic document, the electronic document comprising a number of objects;
the compressor to determine for each object of the document whether data of that object is to be compressed with lossy or lossless compression and to compress the data accordingly to generate a compressed electronic document, wherein the compressor is to determine whether an object is to be compressed with lossy or lossless compression based on a histogram flatness of the object, a histogram span of the object, and a luminance variability of the object.

2. The device of claim 1, the device to process the compressed electronic document as a print job for a printer.

3. The device of claim 1, the compressor to determine whether an object is to be compressed with lossy or lossless compression based on a level of complexity of that object.

4. The device of claim 1, the compressor, in response to a determination to use lossless compression on an object, to select one of a plurality of different lossless compression methods to use to compress that object.

5. The device of claim 4, the compressor to select one of a plurality of different lossless compression techniques to use to compress an object by compressing data for that object using each of the plurality of different lossless compression methods and, for each compression, measuring compression time taken and compressed file size.

6. The device of claim 1, the compressor, in response to a determination to use lossy compression on an object, to determine an optimal compression factor for the lossy compression.

7. The device of claim 6, wherein the lossy compression comprises Joint Photographic Experts Group (JPEG) compression and the optimal compression factor comprises a Q factor for the JPEG compression.

8. The device of claim 6, the compressor to compress data for the object using lossy compression and a plurality of different compression factors, and, for each different compression factor, to extract features of the compressed object from which to calculate image quality of the object after decompression, the compressor to select as the optimal compression factor one of the plurality of different compression factors resulting in a calculated image quality of the object after decompression satisfying a decompressed image quality minimum threshold and having a lowest processing time as compared to other compression factors.

9. A method of optimizing compression of data for an electronic document comprising a number of different objects, the method comprising:
for each object of the document, selecting whether data for that object is to be compressed with lossy or lossless compression based on a level of complexity of that corresponding object, wherein the complexity of the corresponding object is based on a histogram flatness of the object a histogram span of the object, and a luminance variability of the object; and
separately compressing the data for each object using a corresponding selected one of lossy and lossless compression to produce a compressed electronic document.

10. The method of claim 9, wherein the selecting and compressing are performed by a printer client, the method further comprising transmitting the compressed electronic document as a print job to a printer.

11. The method of claim 9, wherein the selecting and compressing are performed in a printer that has received the electronic document as a print job.

12. The method of claim 9, further comprising in response to a selection to use lossless compression for an object, determining which among a plurality of different lossless compression methods to use.

13. The method of claim 9, further comprising, in response to a selection to use lossy compression for an object, determining an optimal compression factor for the lossy compression.

14. A non-transitory computer-readable medium comprising instructions that, when executed by a processor of a device, cause the device to:
receive an electronic document comprising a number of objects;
determine, for each object, whether data for that object is to be compressed with lossy or lossless compression based on a level of complexity of the corresponding object, wherein the complexity of the corresponding object is based on a histogram flatness of the object, a histogram span of the object, and a luminance variability of the object; and
apply a corresponding lossy or lossless compression to the object to generate compressed data for the electronic document.

* * * * *